(12) United States Patent
Shirley et al.

(10) Patent No.: US 6,351,684 B1
(45) Date of Patent: Feb. 26, 2002

(54) MASK IDENTIFICATION DATABASE SERVER

(75) Inventors: Russel Shirley, Pflugerville; Michael R. Conboy; Horace Paul Bowser, Jr., both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/665,646

(22) Filed: Sep. 19, 2000

(51) Int. Cl.[7] .......................... G06F 19/00; H01L 21/00
(52) U.S. Cl. ...................... 700/121; 700/110; 700/116; 700/226; 438/800
(58) Field of Search ...................... 700/121, 108–110, 700/115, 116, 225, 226; 438/800; 257/798; 414/935; 483/14

(56) References Cited

U.S. PATENT DOCUMENTS

| 5,231,585 A | * | 7/1993 | Kobayashi et al. | ........... 700/96 |
| 5,537,325 A | * | 7/1996 | Iwakiri et al. | .............. 700/121 |
| 5,751,581 A | * | 5/1998 | Tau et al. | ................... 700/115 |
| 5,886,896 A | * | 3/1999 | Lantz et al. | ................ 700/116 |
| 5,972,727 A | * | 10/1999 | Ryan et al. | .................... 438/14 |
| 6,040,095 A | * | 3/2000 | Enichen et al. | ................ 430/5 |
| 6,240,335 B1 | * | 5/2001 | Wehrung et al. | ............ 700/230 |

* cited by examiner

Primary Examiner—William Grant
Assistant Examiner—Paul Rodriguez

(57) ABSTRACT

The physical movement of reticles and solder bump masks within a wafer processing plant are continually tracked and documented in a historical database for the useful life of the reticles or masks. In an example embodiment of the mask tracking method, the method includes moving the masks from one location to another in mask pods. In addition, a mask data set is generated for each mask composed of a mask identification code cross-referenced to a pod identification code and the mask data sets are then stored in a computer arrangement. The mask data sets are then updated in the computer arrangement to include a facility location identification code as each mask moves to a subsequent location during wafer processing. An important advantage is that wafer lots and reticles can now be matched to an event on the processing line and stored as data for later review and analysis.

20 Claims, 4 Drawing Sheets

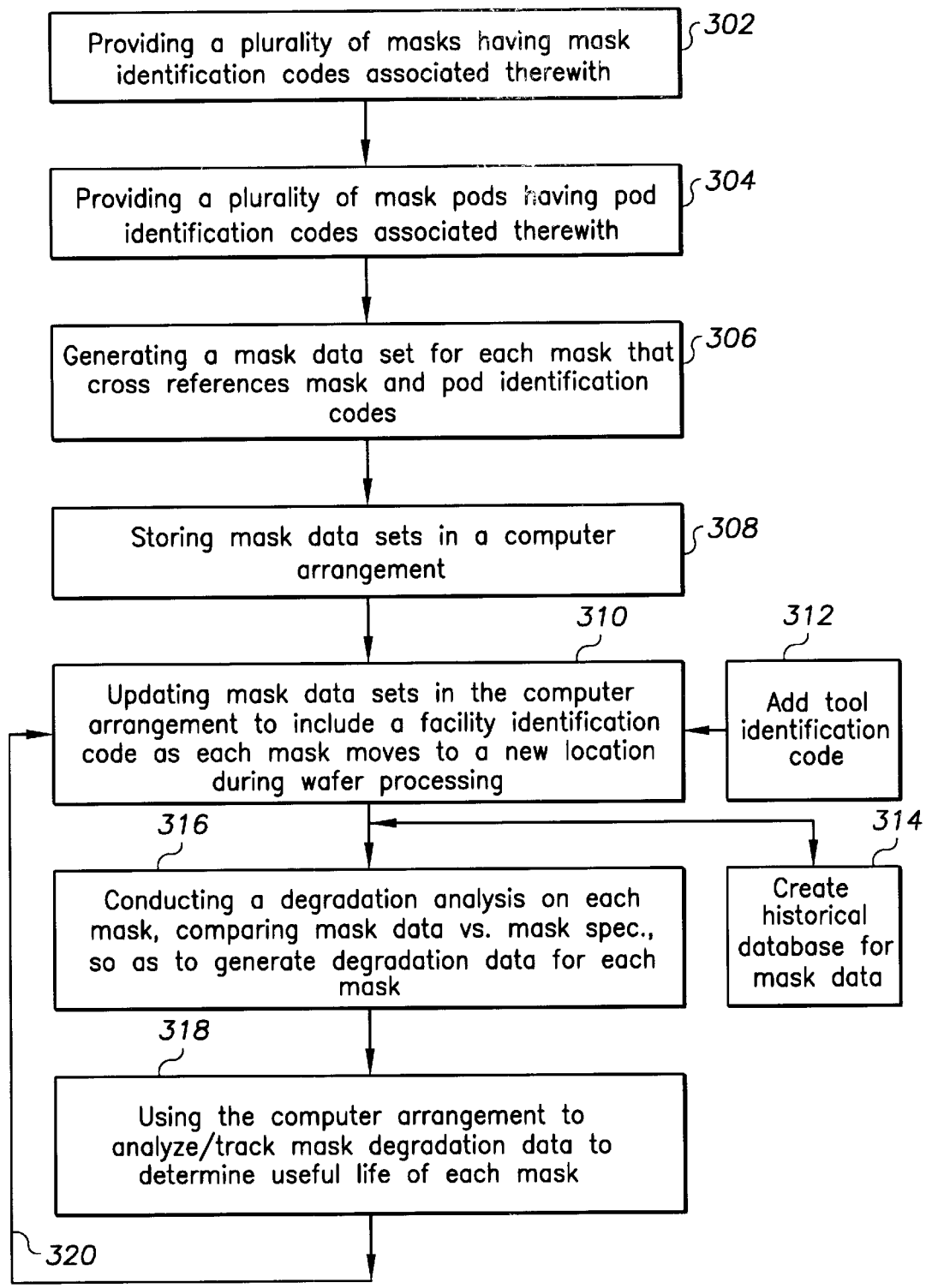

MMSMSK_KIT

| MASK I.D. | POD I.D. | TOOL I.D. | FACILITY I.D. |
|---|---|---|---|
| Mask 1 | Pod 1 | Stepper 1 | Bump |
| Mask 2 | " | " | " |
| Mask 3 | " | " | " |
| Mask 4 | Pod 2 | Inspection I.D. 2 | Off-site |
| Mask 5 | " | " | " |
|  |  |  |  |

MMSREQ_KIT

| RETICLE I.D. | POD I.D. | TOOL I.D. | FACILITY I.D. |
|---|---|---|---|
| RET 1 | Pod 1 | Stepper 1 | Bump |
| RET 2 | " " |  |  |
| RET 3 | " " |  |  |
| RET 4 | Pod 2 | Inspection I.D. 2 | Off-site |
| RET 5 | " | " | " |
|  |  |  |  |

MASK IDENTIFICATION DATABASE SERVER

FIELD OF THE INVENTION

The present invention generally relates to manufacturing processes and equipment using masks and masking structures and, more particularly, to tracking the movement and useful life of masks in an entire semiconductor processing system.

BACKGROUND OF THE INVENTION

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing, or chemical vapor deposition. Material stockers or stocking tools generally are located about the plant and store semiconductor wafers waiting to be processed. The wafers are typically stored in containers, such as cassettes, each of which can hold up to 25 wafers. The cassettes are then stored in carriers that facilitate movement throughout the plant.

The semiconductor fabrication plant, including the bays, material stockers and the interconnecting path, typically operates under control of a distributed computer system running a factory management program. In this environment, the automated material handling system (AMHS) conceptually includes the cassettes, the transportation system (e.g., paths) and control system (e.g., the distributed computer system). The AMHS also typically include empty carriers management system as well as a separate test wafer management system.

A wafer is subjected to a photolithography process of some type and usually involves applying a layer of photoresist material, such as silicon dioxide, over the surface of a wafer using a coating machine. The wafer is then moved to an exposure tool, such as a photolithography stepper, that exposes the photoresist layer to a patterned light source. The light source is patterned using a mask structure or a reticle. The reticle contains clear and opaque features that generally define the pattern to be created in the photoresist layer. The exposed photoresist is then developed and regions of the photoresist are dissolved leaving a pattern on the photoresist layer. The exposed portions of the underlying wafer are then subjected to further processing.

Depending on the type of IC device being manufactured, the wafer may be subjected to the photolithography process several times as layers are formed successively over prior layers to ultimately form the semiconductor device. To perform the various photolithography processes, a semiconductor plant has a photolithography processing area that occupies a substantial amount of floor space and involves a high level of capital investment to maintain. The photolithography area usually includes a number of steppers that utilize an entire cataloged library of reticles. The number of reticles that need to be readily available can easily exceed one thousand, due to the number of different products that can be manufactured in one facility, with each reticle having a replacement cost of about $15K. The reticles are usually stored in a reticle storage system, centrally located within the photolithography area, and are cataloged by reticle identification number. The reticle is then transported via a conveyor system to the particular stepper in need of a certain reticle. One of the problems with managing reticles is that they are very delicate structures and can be damaged easily by excessive handling. They also need to be routinely inspected to ensure that they are still viable for use in making the intended product.

Cycle times for the photolithography processing areas have increased due to the wafer processing system's limited resources that are available to manage all of the options available on the processing line. One of the with the current reticle management systems is the substantial manual intervention required in managing the finite number of reticles in inventory, the limited number of the duplicate reticles available and the finite number of pods that move the reticles around the photolithography area. In addition, operators on the line must manually coordinate any changes to the reticle flow or storage plan. This approach has led to delays in the wafer processing system and has caused inefficiencies in manufacturing. Further, midstream changes in production are relatively difficult and slow to respond to due to the decentralized management of reticles and reticle storage locations.

Many of the problems faced in managing reticles also apply to the management, handling and use of solder bump masks. A solder bump mask is another type of mask used in the manufacture of flip chips that is delicate and needs to be handled carefully. In the solder interconnect process, typically known as the controlled-collapse chip connection (C4) process, a pattern of solder bumps is deposited on a wettable conductive terminal of a flip chip. The solder bump pattern is then coupled to a substrate and reflowed to create an electrical and mechanical connection from the chip to the substrate. The solder bumps are typically formed by evaporating lead (Pb) through openings in a molybdenum mask that is clamped to the wafer. Using a laser to form many holes corresponding to the individual chip contacts on the wafer forms the mask. Solder bump masks tend to wear down more quickly than reticles due to the frequency of use and the cleanings with harsh chemicals. To ensure consistency in precision in the formation of the solder bump pattern, solder bump masks are discarded regularly. However, most solder bump masks are discarded prematurely since a closer inspection would indicate that the bump masks are still suitable for use, hence an increased cost in the manufacture of flip chip devices in not using a viable chip processing component.

SUMMARY OF THE INVENTION

The present invention is directed to addressing the above and other needs in connection with improving efficiencies of tracking reticles and bump masks in a wafer processing system.

According to one aspect of the invention, it has been discovered that reducing the amount of handling of reticles and solder bump masks and determining early the useful life of the mask reduces the overall capital investment in this area. A system for tracking the movement of masks in the wafer processing system will help in efforts to reduce the number of times that a mask is handled, thereby reducing cycle time, and will aid in the real time evaluation of the viability of masks for wafer processing.

According to another aspect of the invention, a method and a system for tracking the movement of masks used in a wafer processing facility includes moving the masks from one location to another in mask pods. In addition, a mask data set is generated for each mask that is composed of a mask identification code cross-referenced to a pod identification code and then the mask data sets are stored in a computer arrangement. The mask data sets are then updated in the computer arrangement to include a facility location identification code as each mask moves to a subsequent location during wafer processing. An important advantage is that wafer lots and reticles can now be matched to an event on the processing line and stored as data for later review and analysis.

According to yet another aspect of the present invention, a method and a system for tracking the movement of masks used in a wafer processing facility includes generating a mask data set for each mask in a pod that includes information on a mask identification code cross referenced to a pod identification code. The mask data sets are then stored in a computer arrangement and updated to include a facility location identification code as each mask moves to a new and subsequent location during wafer processing. A degradation analysis is then conducted on each mask that includes a comparison of the mask data set to a mask baseline specification so as to generate degradation data for each mask. The computer arrangement is then used to analyze and track the mask degradation data to determine the useful life of each mask. An important advantage of this method is that mask handling is reduced, thereby extending their useful life. Wafer processing cycle time is also reduced since knowing the exact location of each mask during wafer processing provides the host system or the MCS the flexibility of re-routing certain masks to the processing of more critical wafer lots due to a business judgment rule, management directive or quality issue that has surfaced.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 3 illustrates a flowchart of the manner in which masks are tracked in a wafer processing facility in accordance with an example embodiment of the invention; and FIG. 4A is a table representing the mask data sets stored in the database of the computer arrangement tracking various masks used in wafer processing facility in accordance with an example embodiment of the invention; and FIG. 4B is a table representing the reticle data sets stored in the database of the computer arrangement tracking various reticles used in wafer processing facility in accordance with an example embodiment of the invention.

Figure 1:
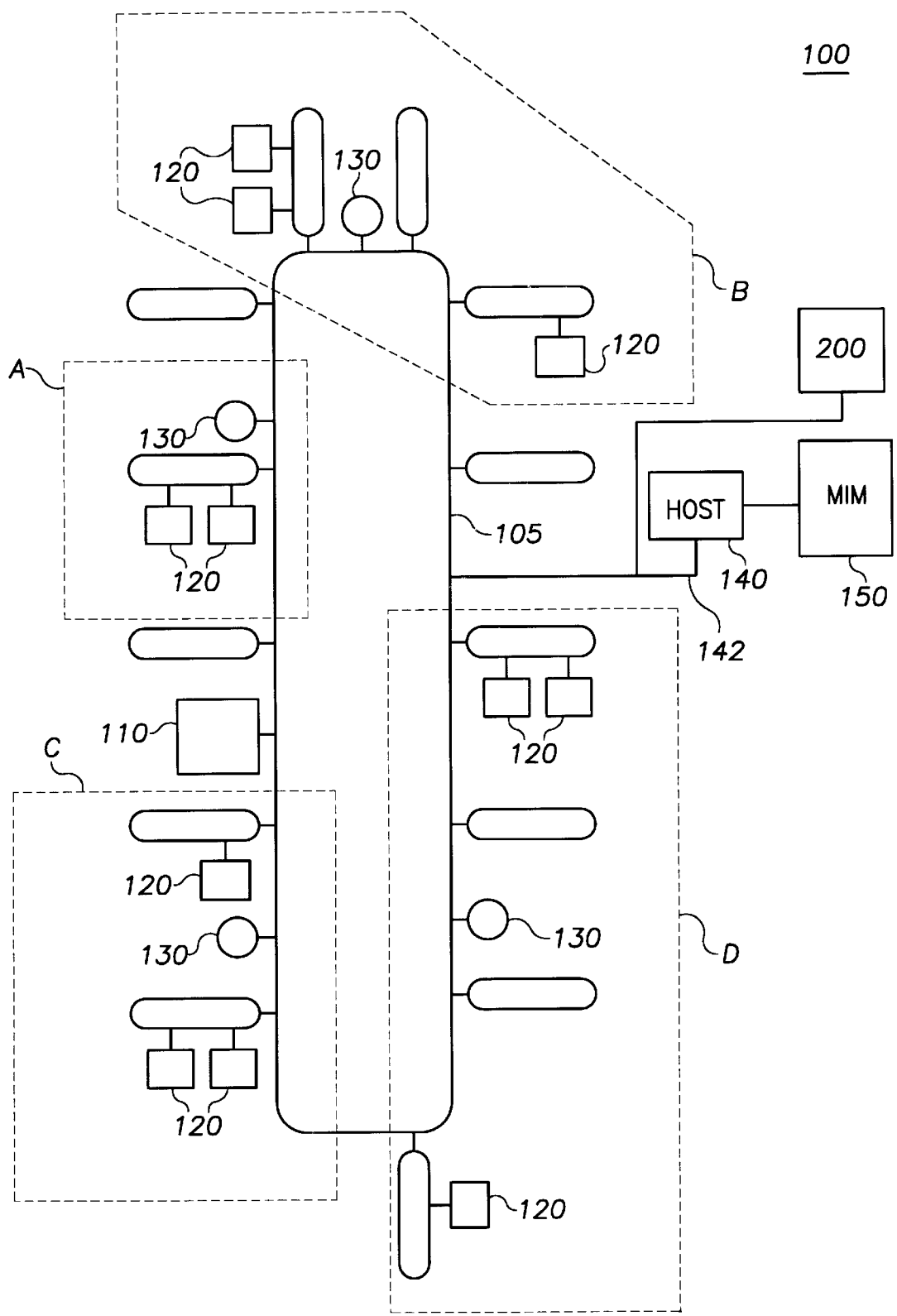
FIG. 1 illustrates an exemplary semiconductor fabrication facility in accordance with an example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a system and method for tracking and handling masks in an IC manufacturing environment, particularly where an automated material handling system is used. While the present invention is not necessarily limited to such an integrated circuit processing application, the invention will be better appreciated using a discussion of exemplary embodiments in such a specific context.

In an example embodiment, the mask tracking system tracks individual masks throughout the wafer processing facility via a database connection from a mask identification server to a stocker, a photolithographic stepper or to another location. The mask server is capable of tracking the mask within the mask pod that the mask is in all the way to an inspection tool. The mask server will also document an event, such as the mask being taken off the line or taken off site. The database within the server allows for combining of the mask into a kit format and for updating the operating system with the pod identification to locate the mask if it is located at a particular tool (tool I.D.) and if it is located at a particular place in the facility (facility I.D.). The system also provides for one to one correspondence with the carrier, through the carrier I.D., and updates the mask tag data (or data set) on a regular basis as the mask moves throughout the facility. The tracking of the masks is automated through the useful life of the mask. Finally, the server creates a historical database of the mask movements and the variations from mask baseline parameters or attributes that are set initially for the masks. The system is equally applicable to reticles, bump solder masks and other types of masks used to create lithographic images in semiconductor structures.

Referring now to the figures, FIG. 1 illustrates an exemplary fabrication facility having a mask tracking management system that is integrated into a wafer processing system. The exemplary fabrication facility 100 includes a transportation path 105, such as a conveyor belt or an automated handling system, for moving masks or reticles around the facility, but primarily within the photolithography area. Reticle storage systems 110 (storage of reticles within cassettes or carriers), photolithography exposure tools such as steppers 120 and various reticle sorters are also included in facility 100. The steppers use a number of different reticles for fabricating layers of semiconductor wafers. This approach is not necessarily limited to the use of photolithography steppers and is applicable to other types of exposure tools that use a reticle or a mask to transfer a pattern onto a wafer or a semiconductor material.

While not shown, it should be appreciated that each of the reticle storage systems 110, reticle sorters 130 and photolithography steppers 120 are communicatively coupled to a host system 140 via a central communications bus 142 and operate under instructions from the host system. The reticle storage system 110 also includes a buffer for storing reticles and cassettes and an inspection system for inspecting various characteristics of the reticles that are transmitted to the host system for database storage. A sorting system capable of rearranging the reticles within the cassettes as dictated by the host system is also included in reticle storage system 110. Facility 100 also includes a management input module 150 that is coupled to host system 140 and a mask tracking system that is communicatively coupled to central bus 142 and host system 140. The management-input module 150 is also coupled to the material handling system and serves to integrate management directives into the mask tracking system.

For further details on the reticle management system and reticle sorting equipment, reference is made to pending application entitled "Integrated Reticle Sorter with Stocker," having Ser. No. 09/545,768 and filed on Apr. 10, 2000, which is herein incorporated by reference. For further details on the management of solder bump masks, reference is made to the pending application entitled "Selection and Storage of Solder Bump Masks for a Solder Patterning Process," having Ser. No. 09/567,515 and filed on May 9, 2000, which is herein incorporated by reference.

Figure 2:
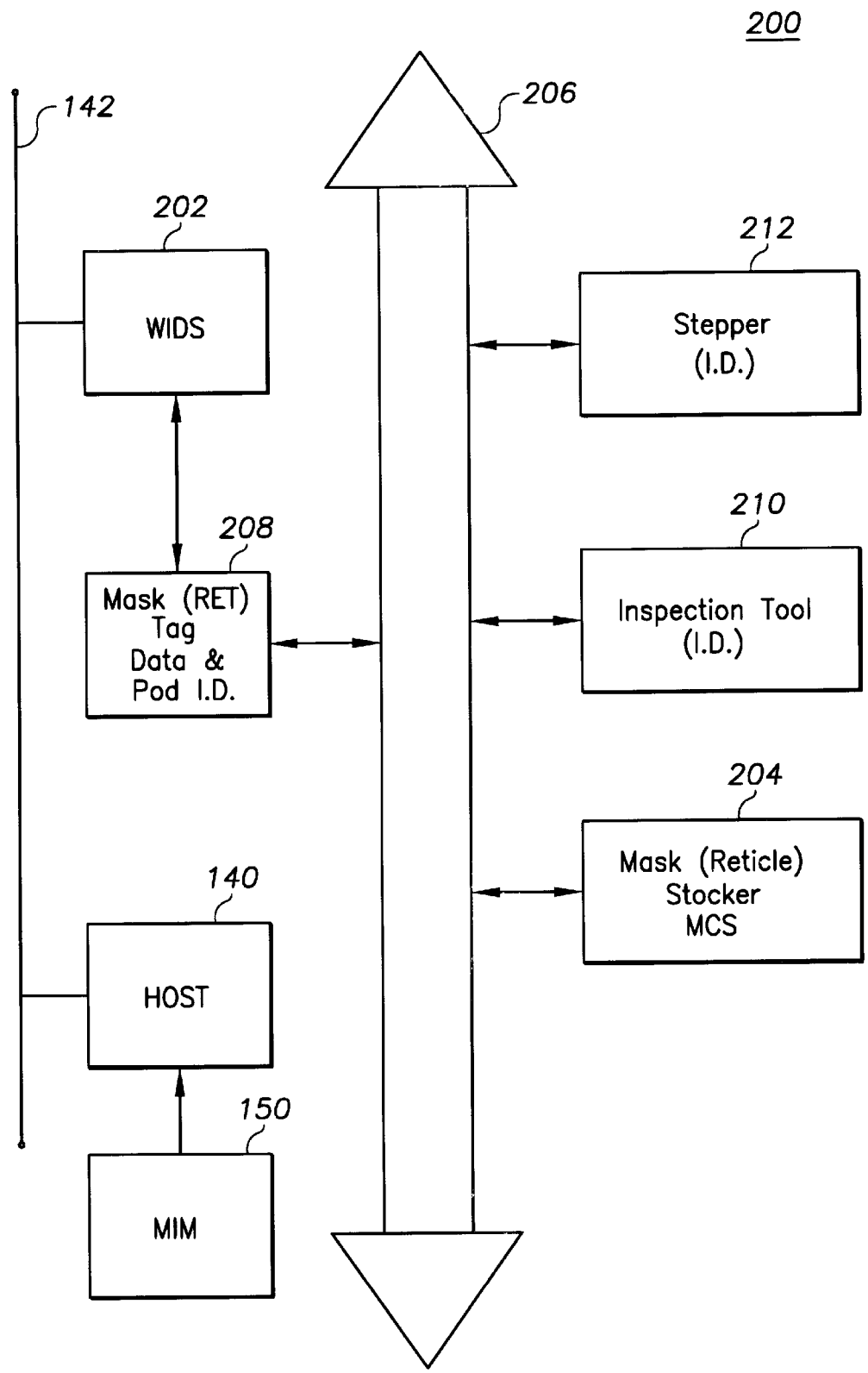
FIG. 2 illustrates a schematic diagram of the mask tracking system in accordance with an example embodiment of the invention.

Referring to FIG. 2, a schematic diagram illustrates mask-tracking system 200 according to the present invention. A wafer identification server (WIDS) 202 is coupled to the central bus 142 and communicates with host system 140. A mask (or reticle) stocker 204 is communicatively coupled to a material control system (MCS) that sends a mask and pod combination to a requested location in the facility. The material control system controls movement of the masks or reticles but does not have the capability of maintaining a historical database of where the mask has been in the facility. Upon leaving stocker 204, a signal is sent via communications bus 206 to WIDS 202 for recording the mask/pod combination as mask data set 208 in the form of a mask tag data and pod I.D. The mask identification code and the pod identification code of the pair are recorded as a mask data set for the selected mask leaving stocker 204. The mask/pod combination can be sent to inspection tool 210 or to stepper 212, each of which have their own identification codes as well as location codes. The location code identifies where in the facility that the mask has moved to and the tool code identifies in which tool the mask is currently being used. The database that collects the historical movement information for each of the masks is located in WIDS 202 or can be separate and coupled to WIDS 202.

Referring to FIG. 3, a flowchart 300 illustrates the manner in which the masks within the pods are tracked as they move from one location to another in the wafer processing facility. At 302, a plurality of masks is provided with each having its own mask identification code. At 304, a plurality of masks pods is provided with each having its own pod identification code. At 306, a mask data set is generated from the cross-referencing of the mask identification code to the pod identification code of a particular mask located within a particular pod. Referring briefly to FIG. 4A, table 400A is a representation of the database that tracks various masks within a wafer processing facility. Note that Mask1 is matched with Pod1 that will generate a mask data set that will be used to track the movement of Mask1 in the wafer plant. At block 308, the mask data sets for all of the masks are then stored in a computer arrangement. At block 310, the mask data sets in the computer are updated to include a facility identification code as each mask moves to a new location during wafer processing. Updates are triggered continuously each time that the masks move to a new tool and/or location.

In a related embodiment, at block 312 the mask's location can be more specifically pin-pointed by including the tool identification code to the mask data set when the mask arrives at the tool (such as a stepper) or arrives at an inspection tool. At block 314, a database is created within the computer to track all of the mask data sets and their historical changes as the masks move through the wafer facility. The database can be used later for analysis purposes. At block 316, a degradation analysis is conducted on each mask that includes comparing the mask data of each mask with the mask baseline specification (or desired mask attributes). This will generate degradation data indicating how much each of the masks has degenerated due to handling, cleaning, particle contamination and the number of exposures. The computer arrangement includes a mask degradation modeling module (not shown), in the form of a software program, that utilizes the gathered mask data to determine how much a particular mask has degraded due to the multiple exposures and the constant handling. The degradation modeling module couples the mask degradation information to the mask identification code and tracks the data to ensure that a particular mask (or reticle) is still within a predefined, acceptable level for making images. At block 318, the computer uses the degradation data of each mask to determine the useful life of each mask as it is tracked in the system. The mask tracking system continually updates the mask data sets, as indicated by line 320, as the material control system (FIG. 2) continues to send routing commands to send masks to various locations throughout the plant.

Referring to FIGS. 4A and 4B, tables 400A and 400B illustrate example portions of mask and reticle data sets, respectively, that are stored in the computer database of the mask identification server 202. In particular, table 400A illustrates how each mask is paired or matched with a particular pod (Mask1/Pod1; Mask4/Pod2; etc.), as well as matching their respectively identification codes (not shown). As each pair moves to a new location or tool located within the plant, the event and location are documented and tied to the data set, thereby creating the historical map of the mask movements throughout the useful life of the mask. Table 400B of FIG. 4B, provides a similar illustration of the data gathered in the case of a reticle that moves about a photo-lithography area.

This method is also applicable to solder bump masks that are moved from storage to different processing areas in the plant. Due to the contact nature and the multiply cycling of the bump masks, tracking and reducing handling of the masks becomes more critical. With respect to reticles, tracking the condition of the reticles is important to ensure that the projected exposure (stacking issue) is within tolerance and the alignment remain within tolerance. The regular feedback of data back to the MCS helps to anticipate when out of tolerance/specification issues will start to affect production.

In a related application, events are tracked in the system by matching the reticle serial number to a selected wafer lot and tying the two to a certain event on the processing line. This information is stored as part of the mask data set. In another embodiment, the mask data set includes the carrier identification code that the mask is matched to, thereby providing another level of accuracy in tracking the masks. The mask tracking system is capable of tracking mask movement from the material stocker or reticle stocker, to a stepper and through to an inspection tool. Even if the mask is taken off-site or off the system, such a move is documented in the database.

As noted above, the above-described approaches are applicable to a number of techniques for tracking masks in integrated circuits manufacturing systems. While the tracking of masks and reticles in a semiconductor facility is illustrated, the invention extends to cover other the management of different types of masks in different environments. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method for tracking the movement of masks used in a wafer processing facility, the masks being moved in mask pods, the method comprising:

generating a mask data set for each mask that includes information on a mask identification code cross-referenced to a pod identification code;

storing the mask data sets in a computer arrangement; and updating the mask data sets in the computer arrangement to include a facility location identification code as each mask moves to a subsequent location during wafer processing.

2. The method of claim 1, wherein the updating step includes adding a tool identification code to the mask data set when the mask arrives to a tool location.

3. The method of claim 2, after the updating step, further including the step of creating a historical database in the computer arrangement for the mask data set for each mask and tracking the movement of each mask when the mask arrives to a new location.

4. The method of claim 1, after the updating step, further including the step of providing a material control system that sends a selected mask to a new location, thereby triggering an update of the mask data set for the selected mask when the mask arrives to the new location.

5. The method of claim 1, wherein the step of storing mask data includes the step of using the computer arrangement to track the condition of each mask, the mask condition including particle contamination, mask degradation, number of exposures, number of times mask is handled and mask structural defects.

6. The method of claim 1, wherein the masks are selected from the group consisting of reticles, wafer processing masks and solder bump masks.

7. The method of claim 6, wherein the step of storing mask data includes the step of using the computer arrangement to match a reticle serial number and a wafer lot to an event on a processing line and storing match data as part of the mask data set.

8. The method of claim 1, wherein the step of storing the mask data set includes matching the mask to a carrier, the carrier having a canter identification code, and storing the carrier code data as part of the mask data set.

9. The method of claim 1, wherein the computer arrangement is adapted to track the mask movement from a material stocker, through a stepper and through an inspection tool while in the pod.

10. A system for tracking the movement of masks used in a wafer processing facility, the masks being moved in mask pods, the system comprising:

means for generating a mask data set for each mask, the mask data set including a mask identification code cross referenced to a mask pod identification code;

means for storing the mask data sets in a computer arrangement; and means for updating the mask data sets in the computer arrangement to include a facility location identification code as each mask moves to a subsequent location during wafer processing.

11. The system of claim 10, wherein the system further includes a material handling system adapted to move the masks and mask pods to multiple locations in the wafer processing facility.

12. The system of claim 10, wherein the mask data set further includes a tool identification code, generated when the mask arrives to a new tool location, that is stored in the computer arrangement.

13. The system of claim 12, wherein the computer arrangement is adapted to create a historical database in the computer arrangement with the mask data set of each mask and is adapted to track the movement of each mask when the mask arrives to a new location.

14. The system of claim 13, wherein the system further includes a material control system that sends a selected mask to a new location, thereby triggering an update of the mask data set for the selected mask when the mask arrives to the new location.

15. A method for tracking the movement of masks used in a wafer processing facility, the masks being moved in mask pods, the method comprising:

generating a mask data set for each mask that includes information on a mask identification code cross-referenced to a pod identification code;

storing the mask data sets in a computer arrangement;

updating the mask data sets in the computer arrangement to include a facility location identification code as each mask moves to a subsequent location during wafer processing;

conducting a degradation analysis on each mask that includes a comparison of the mask data set to a mask baseline specification so as to generate degradation data for each mask; and using the computer arrangement to analyze and track the mask degradation data to determine the useful life of each mask.

16. The method of claim 15, after the step of using the computer arrangement to analyze mask data, further including the step of tracking an event associated with a select wafer lot, wherein the event tracking includes matching the mask identification code with the select wafer lot and storing the event tracking data in the computer arrangement.

17. The method of claim 15, after the updating step, further including the steps of creating a historical database in the computer arrangement for the mask data set for each mask and tracking the movement of each mask when the mask arrives to a new location; and adding a tool identification code to the mask data set when the mask arrives to a tool location.

18. The method of claim 15, after the updating step, further including the step of providing a material control system that sends a selected mask to a new location, thereby triggering an update of the mask data set for the selected mask when the mask arrives to the new location.

19. A method of claim 15, wherein the step of storing mask data includes the step of using the computer arrangement to track the condition of each mask, the mask condition including particle contamination, mask degradation, number of exposures, number of times mask is handled and mask structural defects.

20. A system for tracking the movement of masks used in a wafer processing facility, the masks being moved in mask pods, the method comprising:

means for generating a mask data set for each mask that includes information on a mask identification code cross referenced to a pod identification code;

means for storing the mask data sets in a computer arrangement;

means for updating the mask data sets in the computer arrangement to include a facility location identification code as each mask moves to a subsequent location during wafer processing;

means for conducting a degradation analysis on each mask that includes a comparison of the mask data set to a mask baseline specification so as to generate degradation data for each mask; and means for using the computer arrangement to analyze and track the mask degradation data to determine the useful life of each mask.

\* \* \* \* \*

UNITED STATES PATENT AND TRADEMARK OFFICE
CERTIFICATE OF CORRECTION

PATENT NO.   : 6,351,684 B1
DATED        : February 26, 2002
INVENTOR(S)  : Shirley et al.

It is certified that error appears in the above-identified patent and that said Letters Patent is hereby corrected as shown below:

Column 1,
Line 33, "include" should read -- includes --.

Column 2,
Line 7, "of the with" should read -- of the problems with --.

Column 6,
Line 34, "multiply" should read -- multiple --.
Line 39, "remain" should read -- remains --.
Line 60, after "cover" please delete "other the."

Signed and Sealed this

Tenth Day of December, 2002

JAMES E. ROGAN
*Director of the United States Patent and Trademark Office*